United States Patent
Back (10) Patent No.: US 6,894,480 B2
(45) Date of Patent: May 17, 2005

(54) WAFER PROBING TEST APPARATUS AND METHOD OF DOCKING THE TEST HEAD AND PROBE CARD THEREOF

(75) Inventor: Seung-Gook Back, Osan (KR)

(73) Assignee: Samsung Electronics Co., Ltd., Suwon-si (KR)

(*) Notice: Subject to any disclaimer, the term of this patent is extended or adjusted under 35 U.S.C. 154(b) by 85 days.

(21) Appl. No.: 10/347,240

(22) Filed: Jan. 21, 2003

(65) Prior Publication Data

US 2004/0140794 A1 Jul. 22, 2004

(30) Foreign Application Priority Data

Jan. 7, 2002 (KR) .............................. 10-2002-0000773

(51) Int. Cl.[7] .............................................. G01R 31/00
(52) U.S. Cl. .................................. 324/158.1; 324/758
(58) Field of Search .......................... 324/754, 757–758, 324/765, 158.1; 73/865.7, 865.9, 866.5

(56) References Cited

U.S. PATENT DOCUMENTS

| 5,241,870 A | 9/1993 | Holt | |
|---|---|---|---|
| 5,404,111 A | * 4/1995 | Mori et al. | 324/758 |
| 5,642,056 A | * 6/1997 | Nakajima et al. | 324/758 |
| 5,656,942 A | * 8/1997 | Watts et al. | 324/754 |
| 6,111,419 A | * 8/2000 | Lefever et al. | 324/754 |

FOREIGN PATENT DOCUMENTS

| JP | 64-053428 | 1/1989 |
|---|---|---|
| JP | 11-030647 | 2/1999 |
| KR | 10-0240476 | 10/1999 |

* cited by examiner

Primary Examiner—Minh N. Tang
(74) Attorney, Agent, or Firm—Volentine Francos & Whitt, PLLC (57) ABSTRACT

Wafer probing test apparatus includes a main body, a test head having a plurality of pogo pins at its bottom surface, a probe card for engagement with the test head, a position sensor for sensing when the test head is oriented properly for docking with the probe card, and a docking height sensor for sensing when the test head arrives at the proper docking height. The sensors include a plurality of position sensor protrusions and at least one height sensor protrusion formed on the bottom of the test head, a plurality of position limit switches and a down limit switch. The switches are operated in response to the insertion and withdrawal of the position sensor protrusions into and from holes formed in the probe card.

14 Claims, 6 Drawing Sheets

WAFER PROBING TEST APPARATUS AND METHOD OF DOCKING THE TEST HEAD AND PROBE CARD THEREOF

BACKGROUND OF THE INVENTION

1. Field of the Invention

The present invention relates to the testing of electric characteristics of integrated circuits formed on a semiconductor wafer. More specifically, the present invention relates to a wafer probing test apparatus having a test head that is docked with a probe card though which electrical signals are passed to and from integrated circuits on a semiconductor wafer.

2. Description of the Related Art

Generally, integrated circuits are fabricated on a wafer and are then electrically tested before being packaged to ensure the reliability of the circuits. Electrical die sorting (EDS) is used for electrically testing the unpackaged integrated circuits as they are formed on the wafer. One test device for use in carrying out EDS is a wafer probing machine. The wafer probing machine tests the integrated circuits by placing probe needles in direct contact with metallic pads formed on the integrated circuits.

The conventional wafer probing machine comprises a test head which can move linearly up and down, and a pogo block having a plurality of pogo pins installed on the bottom of the test head. A probe card is installed in a lower part of the overall apparatus, and a wafer chuck is provided under the probe card for supporting the semiconductor wafer to be tested. The test head is docked with the probe card during the testing process.

The probe card is usually replaced on occasion, for example when the type of semiconductor wafer being tested changes or when the probe card is damaged or broken. Whenever the probe card is replaced, the wafer probing machine must be reset. Every time the wafer probing machine is reset, the test head must be precisely docked once again with the probe card.

More specifically, the test head of the wafer probing machine must be brought to a predetermined position with respect to the probe card during the resetting of the wafer probing machine. In this case, the test head is raised to a certain height and then is forced downwardly to dock with the probe card. At this time, the test head should be precisely positioned relative to the probe card, with respect to both its polarity and vertical alignment. Otherwise, the test head will collide with the probe card, resulting in damage to the probe card or poor contact between the pogo pins of the test head and probe needles of the probe card. If either of these conditions occurs, the results of the testing of the integrated circuits become unreliable.

However, it is very difficult to determine whether the test head is properly positioned relative to the probe card. Also, the position at which the test head is docked with the probe card is typically adjusted manually by a test operator. Therefore, the docking position is never precise. In fact, tests shown in FIG. 6 reveal that the docking position may vary in height by several mms throughout the course of resetting the wafer probing machine several times.

Furthermore, if the operator forces the test head and the probe card together during the docking thereof, the probe card tends to be bent downward at the center portion thereof. In this case, probe needles of the probe card become inclined toward the center of the probe card. As a result, the contact between the probe needles and the pads formed on the semiconductor device (the contact height) becomes uneven. Furthermore, the ends of the probe needles are worn down when the operator forces the test head to dock with the probe card while the docking position is not precise.

In addition, the probe card may adhere to the test head as if by suction. In this case, the probe card tends to be bent upwardly at the center portion thereof when the docking position is not precise. As a result, the probe needles are deformed. Therefore differences occur in the contact heights between the probe needles and the pads during a hot test, i.e., a test performed at a high temperature.

An improved technology for securing the probe card to the test head is disclosed in Japanese Patent Laid Open Publication No. Hei 11-30647. Referring to this publication, the test head has guide pins, and corresponding guide holes are formed in the probe card. The probe card is received in a head plate and is secured thereto by a floating clamp ring. The docking of the test head with the probe card is thus facilitated by the guide pins and guide holes when the test head is moved downwardly towards the probe card. Furthermore, the shock caused by the downward force of the test head is absorbed by an elastic member interposed between the clamp ring and the head plate.

However, this technology still presents some problems. For example, it is difficult to detect whether the test head is properly docked with the probe card because the test operator evaluates the docking state by eye by trying to observe the state of engagement of the guide pins and guide holes. Furthermore, it is still difficult to prevent the test head from striking the probe card with an excessive force because the operator operates the test head manually.

SUMMARY OF THE INVENTION

An object of the present invention is to overcome the problems of the prior art described above. Therefore, one object of the present invention is to provide wafer probing test apparatus and a method of docking the test head and probe card thereof, wherein the position of the test head is sensed automatically. Likewise, another object of the present invention is to provide wafer probing test apparatus and a method of docking the test head and probe card thereof, wherein the movement of the test head toward the probe card is stopped automatically so as to prevent the probe card from being damaged.

The wafer probing test apparatus of the present invention includes a main body which supports the probe card, a test head installed over the main body and having a plurality of pogo pins at its bottom surface, a position sensor for sensing the position of the test head relative to the probe card when the test head is moved down onto the probe card, and a docking height sensor for sensing when the test head is moved down to a docking height relative to the probe card.

The main body comprises an insert ring which has a plurality of guide holes in an upper surface thereof. The probe card, on the other hand, has a plurality of guide pins. These guide pins are received in the guide holes to maintain the probe card precisely in place during the docking operation, for instance.

The position sensor is operative to turn on when the test head is properly positioned (polarity and specially alignment) with respect to the probe card. To this end, the position sensor includes a plurality of position sensing protrusions formed on the bottom of the test head and a plurality of corresponding holes formed in the probe card and into which the protrusions can be inserted and penetrated, respectively. The position sensor further includes one or more position limit switches which are turned off when the protrusions are contacted with a point except the holes. The docking height sensor may also include a height sensing protrusion, as well as a down limit switch that is operative to turn on when the height sensing protrusion is contacted with the probe card, e.g., when the pogo pins are contacted with the probe card.

A length of the position sensor protrusion is longer than the height sensor protrusion.

In operation, the test head is mechanically driven (forced) downwardly toward the probe card while the position sensor is on and the docking height sensor is off and until the test head becomes disposed at a predetermined height. At this time, if the position sensor remains turned-on and a docking height sensor contacts the probe card, the docking height sensor is turned on. Otherwise, if the position sensor becomes turned-off, that is, if position sensor protrusions of the position sensor come into contact with points on the probe card other than when being inserted into corresponding holes in the probe card, the test head is raised, the orientation thereof is adjusted, again the position sensor becomes turned-on and then the test head is driven back down to the predetermined height while the position sensor is still on. The docking height sensor turns off once the test head is positioned at a predetermined height relative to the probe card. The downward movement of the test head is stopped automatically when the docking height sensor is turned off, and the test head is locked in place once the downward movement of the test head is stopped.

BRIEF DESCRIPTION OF THE DRAWINGS

These and other objects, features and advantages of the present invention will be better understood from the following detailed description thereof made with reference to the accompanying drawings, in which like reference numerals designate like elements, and of which.

DETAILED DESCRIPTION OF THE PREFERRED EMBODIMENTS

Figure 1:
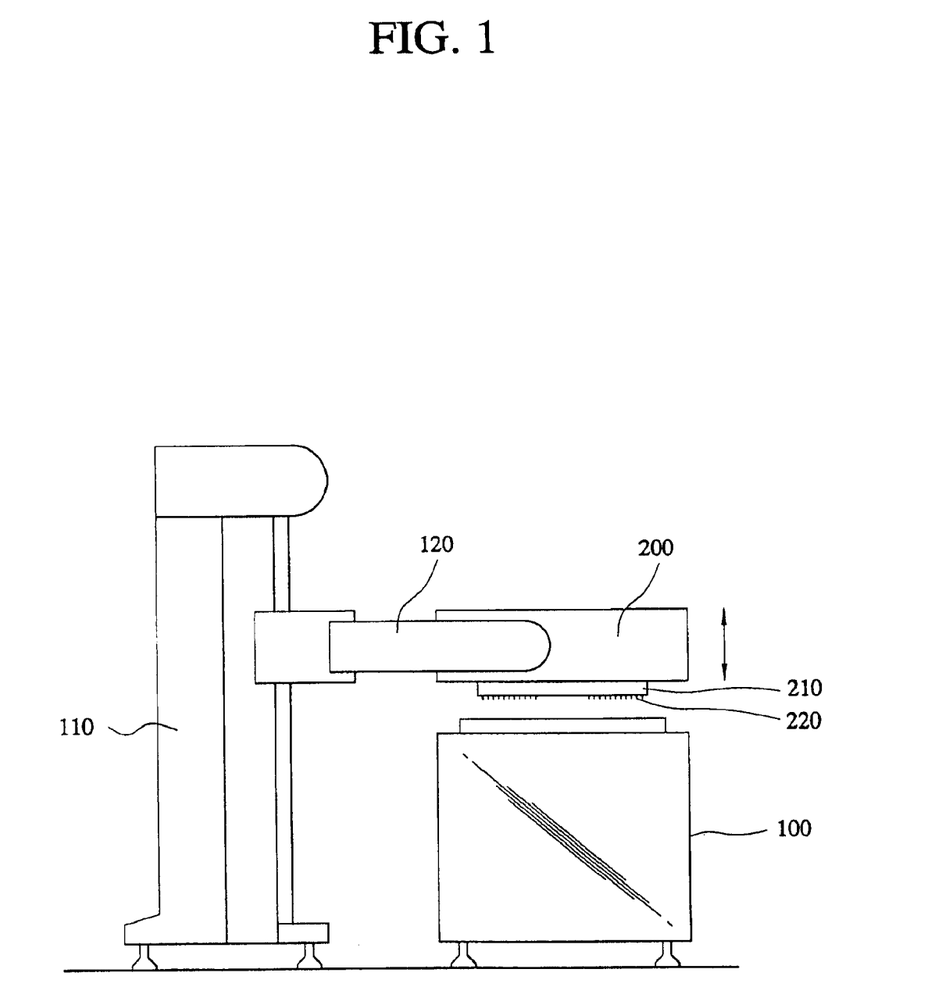
FIG. 1 is a schematic diagram of a wafer probing machine in accordance with the present invention.
Figure 2A:
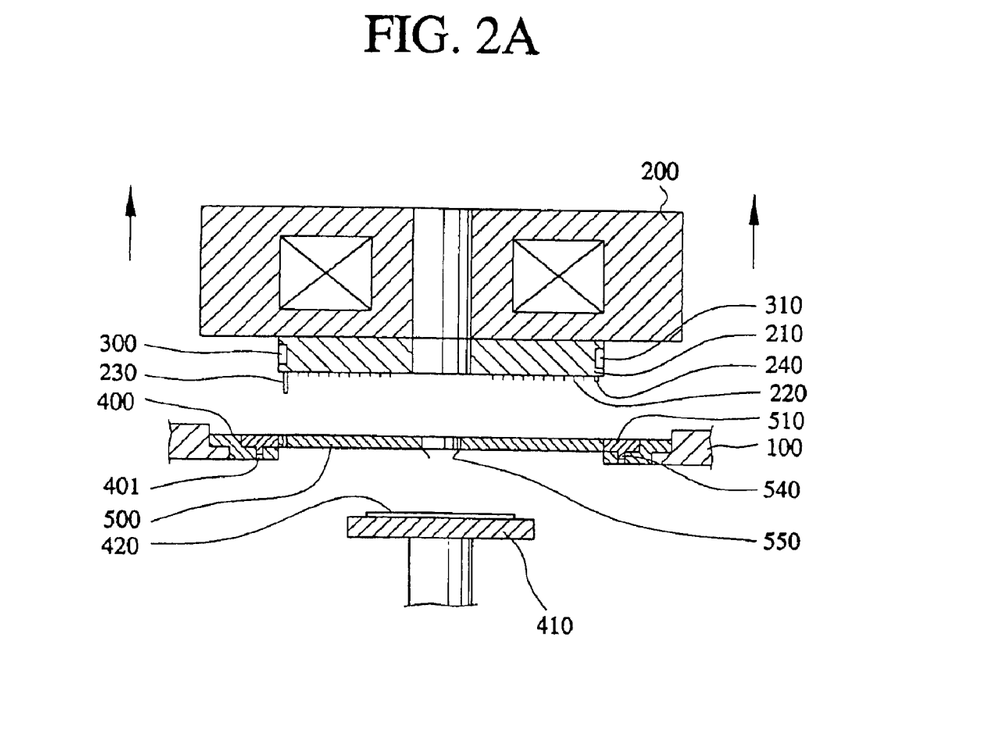
FIG. 2A is a sectional view of a test head of the wafer probing machine and a probe card before the test head and the probe card are docked.
Figure 2B:
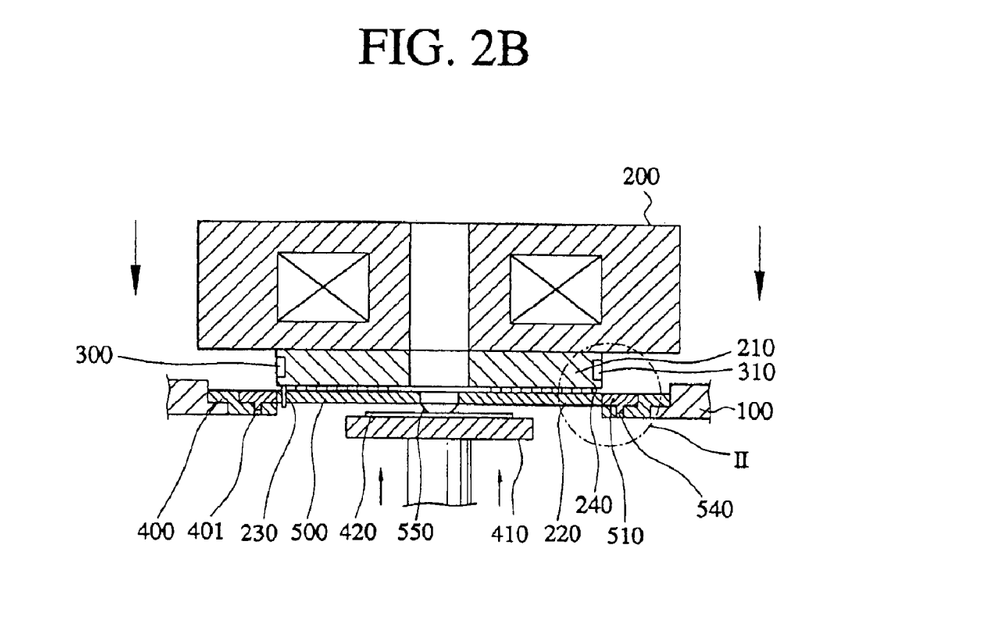
FIG. 2B is a sectional view of a test head of the wafer probing machine and a probe card after the test head and the probe card are docked.

Referring first to FIGS. 1, 2A and 2B, wafer probing test apparatus in accordance with the present invention comprises a main body 100 on which a probe card 500 is placed before being docked with a test head, a test head 200 installed over the main body 100, and a manipulator 110 and a lifting arm 120 for applying electrical test signals to the probe card 500 and for moving the test head 200 linearly up and down.

The main body 100 has an aperture in the center thereof, and a wafer chuck 410 on which a wafer 420 is supported is situated in the aperture. Furthermore, the main body 100 supports the probe card 500 to facilitate the testing of the wafer 420.

The test head 200 is connected to an end of the lifting arm 120. Therefore, the test head 200 is moved linearly up and down over the main body 100 as the lifting arm 120 moves up and down. The test head 200 comprises a pogo block 210 having a plurality of pogo pins 220 on a bottom surface thereof. The pogo pins receive programmed electrical signals from the manipulator 110 and transmit the same to the integrated circuits on the wafer.

The manipulator 110 is installed at a side of the main body 100 and operates under a plurality of programs to move the test head 200 up and down via the lifting arm 120, to control the docking position and height of the test head 200, and to apply electrical signals to the test head 200.

One end of the lifting arm 120 is engaged with the manipulator 110 such that the arm 120 moves up and down under the control of and as guided by the manipulator 110. The other end of the lifting arm 120 is connected to the test head 200 so that the test head 200 also moves linearly up and down along the side of the manipulator 110. The lifting arm 120 is driven by a known device (not shown) such as a motor and a belt, or a ball screw.

Figure 4:
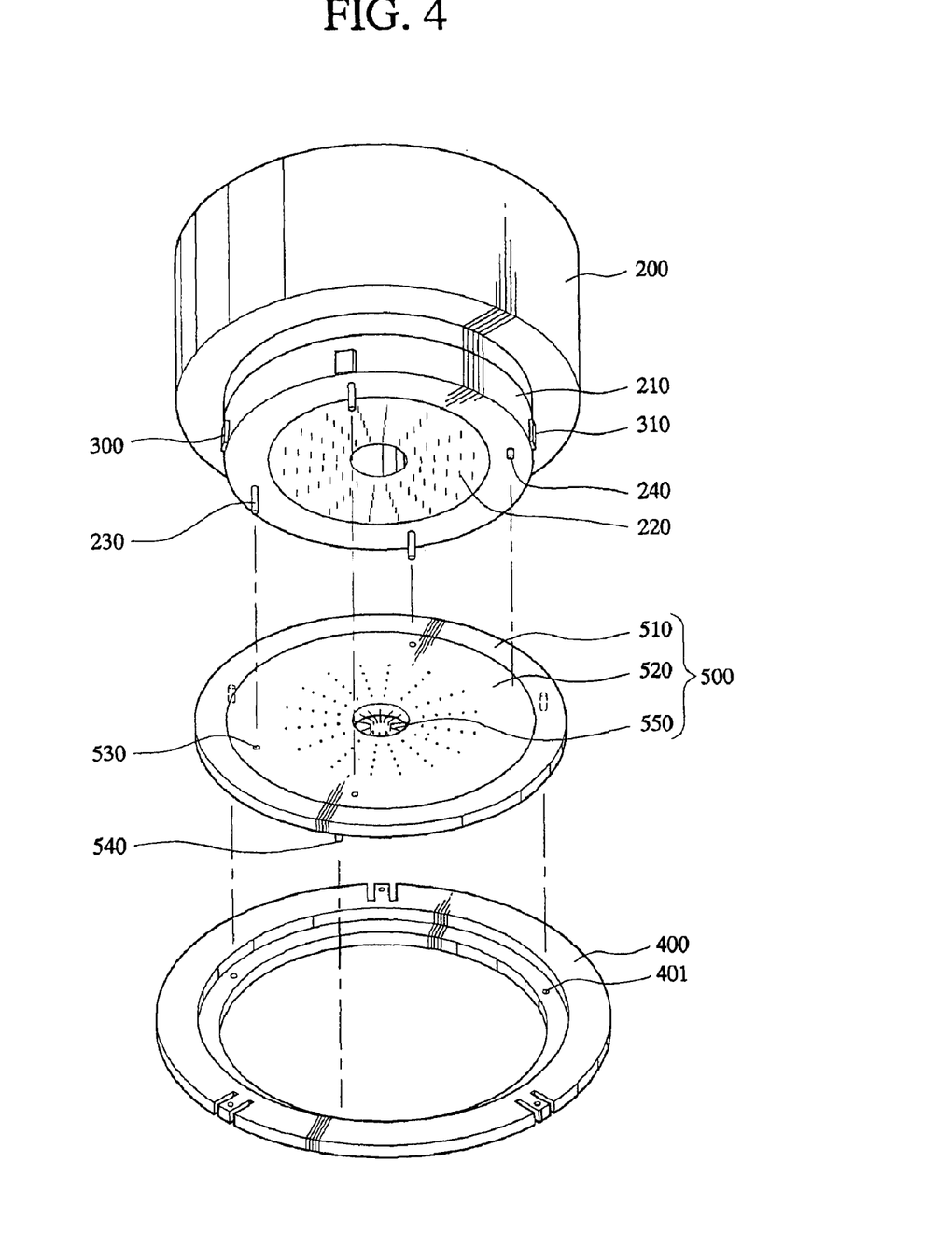
FIG. 4 is an exploded perspective view of an insert ring, a probe card and test head components of the wafer probing machine in accordance with the present invention.

The probe card 500 comprises a card holder 510, a card member 520 having an aperture in its center, and a plurality of probe needles 550. Parts of the probe needles 550 are embedded in the card member 520 and the probe needles 550 extend towards the aperture at the center of the card member 520. The ends of the probe needles 550 located within the aperture are bent downwardly as best shown in FIG. 4.

The probe card 500 is placed on the main body 100 under the pogo block 210. More specifically, the card holder 510 is received in an insert ring 400 installed in an upper part of the main body 100. The insert ring 400 has several guide holes 401 that precisely guide the probe card 500 when the card holder 510 is received in the insert ring 400. To this end, the card holder 510 has a plurality of guide pins 540 corresponding to the guide holes 401, whereby the guide pins 540 can be inserted into the guide holes 401. The guide pins 540 may be formed on the card member 520 instead of the card holder 510. The guide holes 401 and guide pins 540 also serve to keep the probe card 500 stable when an external shock is applied to the probe card 500, the test head 200 is docked or particles or contaminants are removed from the probe card 500.

The probe card 500 also has three holes 530 in an upper surface thereof, and the pogo block 210 has three position sensor protrusions 230 corresponding to the holes 530. The holes 530 and the position sensor protrusions 230 allow the state of contact between the test head 200 and the probe card 500 to be easily determined and the horizontal docking position (x-y direction) to be accurately acquired. That is, the test head 200 can be precisely docked with the probe card 500 when all of the position sensor protrusions 230 formed on bottom surface of the pogo block 210 are precisely inserted into the all holes 530 of the probe card 500.

The pogo block 210 further comprises at least one height sensor protrusion 240 in the bottom surface thereof. The height sensor protrusion 240 contacts the probe card 500 simultaneously when the test head 200 moves downwardly and the pogo pins 220 come into contact with the probe card 500. The height sensor protrusion 240 allows the state of contact between the test head 200 and the probe card 500 to be easily determined and the vertical docking position (z direction) to be accurately acquired.

And as shown in FIGS. 2A and 2B, the position sensor protrusions 230 should be longer than the height sensor protrusion 240.

Figure 3:
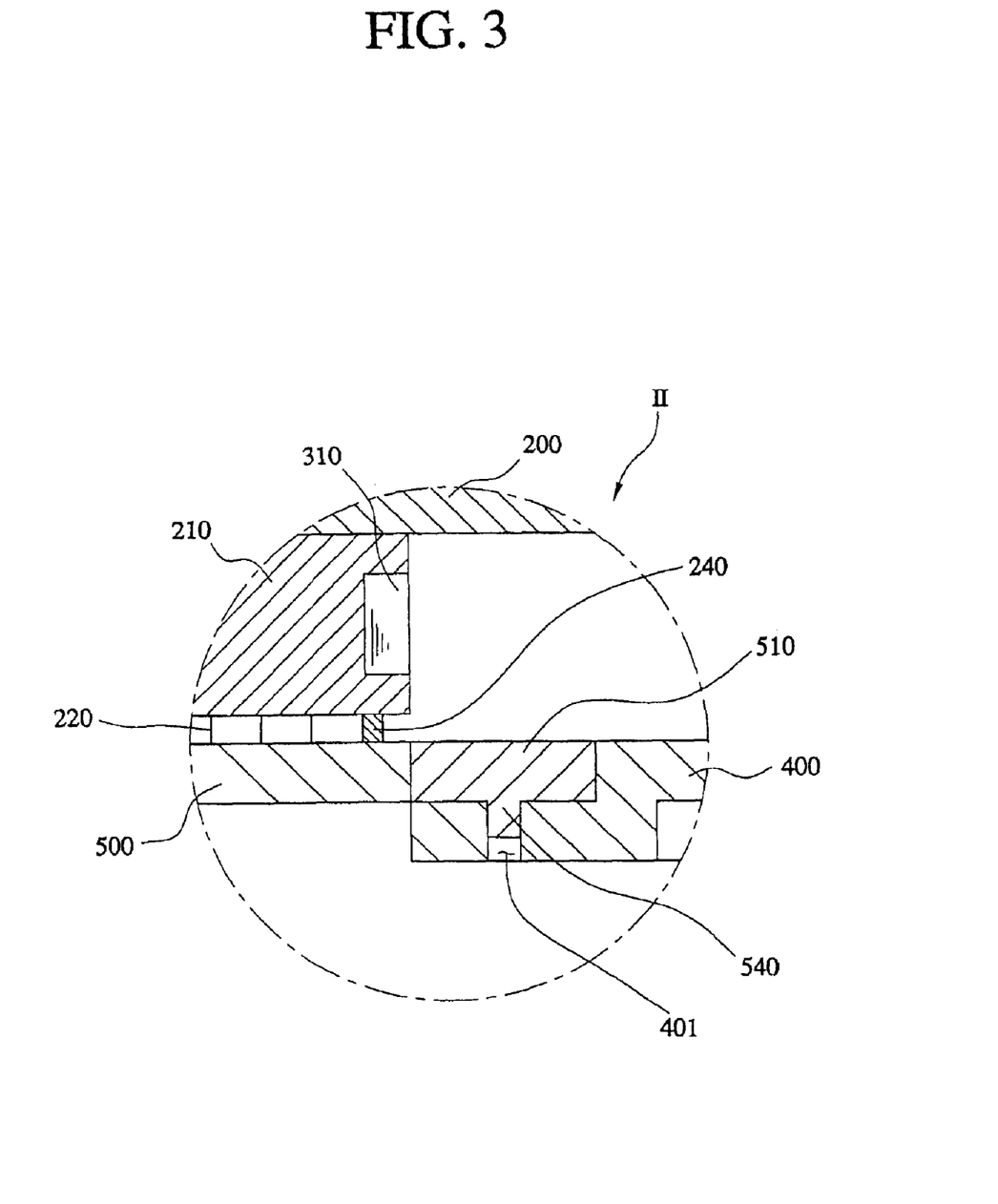
FIG. 3 is a enlarged view of the part II of the wafer probing machine shown in FIG. 2B.

The test head 200 has four limit switches 300, 310, although the present invention is not limited to this number of limit switches. Three of the limit switches are position limit switches 300 and the other is a down limit switch 310. The position limit switches 300 are turned on/off in conjunction with the state of three of the position sensor protrusions 230 of the pogo block 210. More specifically, the position limit switches 300 are turned off, respectively, when associated ones of the position sensor protrusions 230 contact portions of the probe card 500 as opposed to when the position sensor protrusions 230 are received in the corresponding holes 530 formed in the probe card 500. The down limit switch 310 is turned on/off when the height sensor protrusion 240 is contacted with the probe card 400. That is, each of the limit switches 300, 310 operates in response to the movement of a corresponding position sensor protrusion 230 and a corresponding height sensor protrusion 240.

The method of docking the test head in accordance with the present invention will be described below in detail with reference to FIGS. 2A–4.

First, the semiconductor wafer 420 to be tested is placed by a robot arm on the wafer chuck 410, as shown in FIG. 2A. Next, the wafer chuck 410 having the semiconductor wafer 420 thereon is moved upwardly toward the probe card 500 until the pads of the integrated circuits on the semiconductor wafer contact the probe needles 550 of the probe card 500.

Next, electrical signals are applied, according to a program stored in the manipulator 110, to the pads of the integrated circuits via the test head 200 and the probe card 500. Accordingly, the electric characteristics of the integrated circuits are tested.

After all of the integrated circuits on the semiconductor have been tested, the semiconductor wafer is replaced. At this time, the probe card is replaced with another type of card if the new semiconductor wafer includes integrated circuits that are different from the integrated circuits that were present on the previously tested semiconductor wafer. The probe card must also be replaced when the probe card is damaged. After the probe card is replaced or the tester is cleaned, the wafer probing test apparatus is reset.

The resetting of the wafer probing test apparatus will now be described with reference to FIGS. 1–5.

Figure 5:
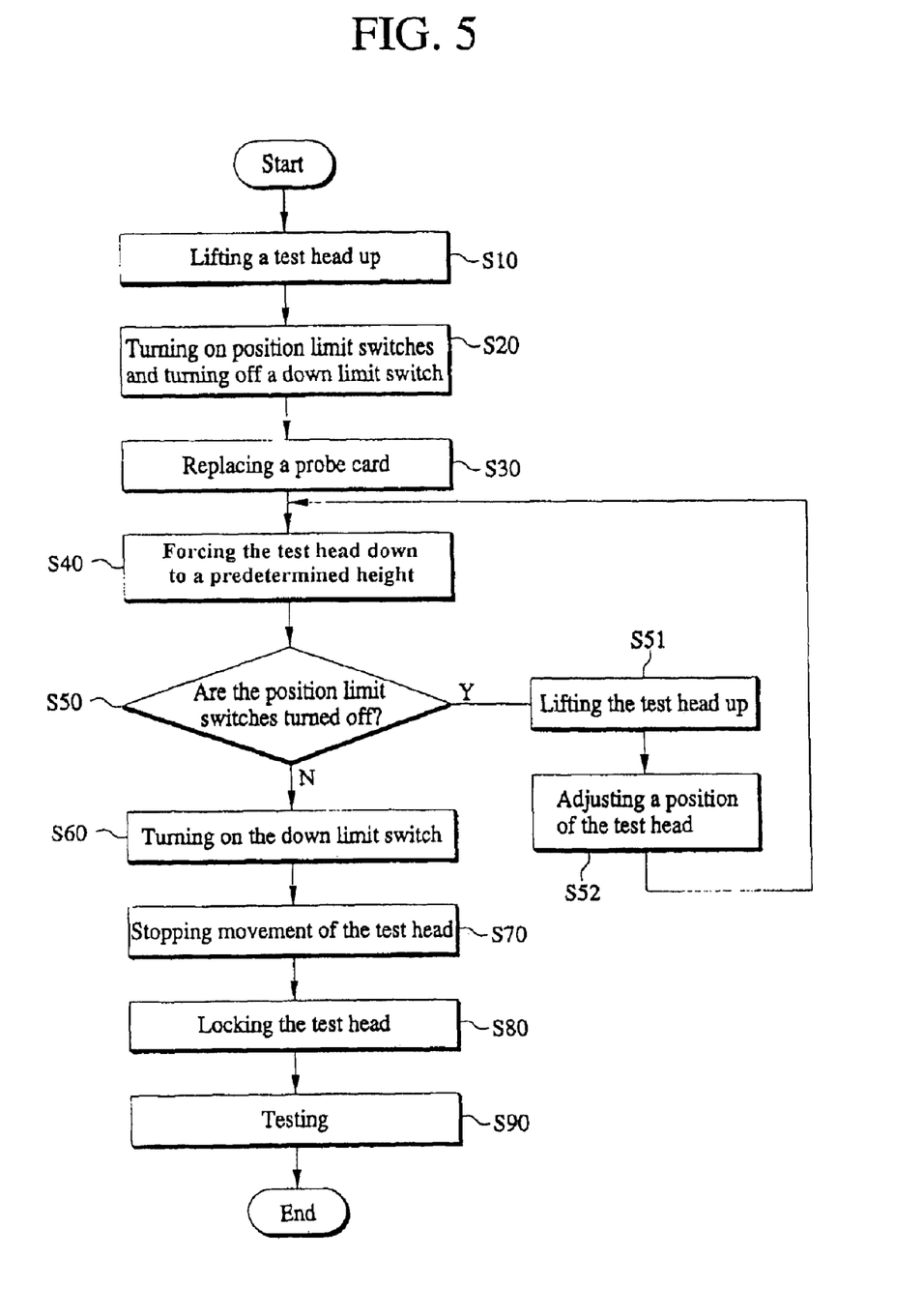
FIG. 5 is a flow chart of a method of controlling the docking of the test head with the probe card in accordance with the present invention.

The test head 200 is first lifted to a certain height by the lifting arm 120 such that the pogo pins 220 engaged with the test head 200 are separated from the probe card 500, as shown in FIG. 2A (S10).

At this time, the position limit switches 300 are turned on. That is, the position limit switches 300 are turned on as soon as the position sensing protrusions 230 of the pogo block 210 are removed from the holes 530 of the probe card 500. On the other hand, the down limit switch 310 is turned off as soon as the height sensing protrusion 240 is separated from the probe card 500 (S20).

Next, the probe card 500 is detached from the insert ring 400 by the test operator and then a new probe card is inserted into the insert ring 400 (S30). The new probe card 500 is properly inserted into the insert ring 400 when the guide holes 401 in the insert ring 400 receive the guide pins 540 formed on the card holder 510. The probe card 500 remains fixed in place in the insert ring 400 due to the guide pins 540 and the guide holes 410. For instance, the probe card 500 will not be displaced even if an external shock were applied to the main body 100 of the wafer probing machine or some external force created during the resetting and driving of the test head 200 were applied to the probe card 500.

Next, the test head 200 is forcibly moved (mechanically driven) downwardly a predetermined distance by the lifting arm 120 so as to confront the probe card 500 (S40). The predetermined distance is set by the manipulator 110. As the test head 200 begins to dock with the probe card 500, the position sensor protrusions 230 of the pogo block 210 are inserted into the holes 530. All of the position limit switches 300 remain in a turned-on state when all of the associated position sensor protrusions 230 are properly inserted into the corresponding holes 530. Therefore, if only one of the position limit switches 300 is turned off after the test head 200 has been moved downwardly by the predetermined distance, the test head is moved up again and its orientation, e.g., planarity and positional alignment, is adjusted (S51, S52). Then, the position sensor becomes turned on and the test head 200 is moved downwardly again.

One position sensor protrusion 230 might not be sufficient to provide a reliable indicator of the horizontal docking state (x-y direction) of the test head 200. Therefore, the pogo block 210 has at least two position sensor protrusions 230, and each of the position limit switches 300 operates in response to the movement of an associated one of the position sensor protrusions 230. In addition, the position sensor protrusions 230 should be spaced at regular intervals. To illustrate these points, when the test head 200 is oriented such that part of the bottom surface thereof is higher than the other, the position sensor protrusion 230 located on the high side of the test head 200 will not be fully, i.e., properly, inserted into the corresponding hole 530. Therefore, the position limit switch 300 operatively associated with this position sensor protrusion 230 will remain in an OFF state. The OFF state of the position limit switch 300 indicates that the test head 200 is not properly oriented with respect to the probe card 500. Thus, the orientation of the test head 200 should be further adjusted. The down limit switch 310 is turned on only when all of the position limit switches 300 remain turned on.

The orientation or relative position of the test head 200 may be adjusted manually by a test operator. However, such a process of manually adjusting the position or orientation of the test head can take a great deal of time. Accordingly, the adjustment of the orientation of the test head is preferably performed using the technique disclosed in Korean Patent Registration No. 10-0240476 or Japanese Patent Application Laid Open No. Sho 64-53428. Other means may be used, as well, for adjusting the test head.

After the orientation of the test head is adjusted if necessary, the test head 200 is moved the predetermined distance back down towards the probe card 500 by the lifting arm 120 (S40). At this time, if all of the position sensor protrusions 230 of the pogo block 210 are properly inserted into the holes 530, all of the position limit switches 300 remain in a turned-on state. This indicates that the test head 200 has been successfully oriented with respect to the probe card 500 (S50).

The down limit switch 310 turns on as soon as the height sensor protrusion 240 is contacted with the probe card 500

(S60), whereupon the down movement of the test head stops (S70). In this case, all of the pogo pins 220 of the pogo block 210 precisely contact the probe card 500. The test head is locked in this position where the down limit switch 310 is turned off, whereby the test head docking operation is completed (S80).

Next, a known test for confirming the docking state of the test head is performed. When the results of this known test indicate that the test head docking is satisfactory, the EDS test of the integrated circuits on the semiconductor wafer 420 is performed (S90).

The EDS test applies electrical signals to the integrated circuits via the manipulator 110, the pogo pins 220 installed of the test head 200 and the probe needles 550 of the probe card 500. Next, test result signals are transmitted to the manipulator 110 through the probe card 500 and the test head 200. The test result signals are analyzed to determine whether the integrated circuits on the semiconductor wafer 420 are normal or have failed. Finally, the integrated circuits are marked in response to the determination, thereby completing the EDS process.

Accordingly, the wafer probing test apparatus in accordance with the present invention allows the docking state to be easily and precisely detected, so that the testing of the integrated circuits becomes more efficient and reliable.

Figure 7:
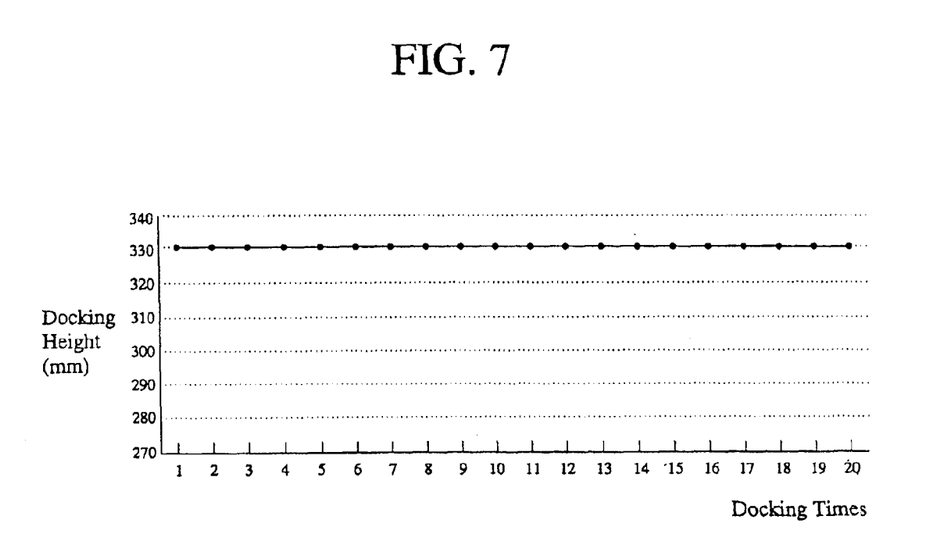
FIG. 7 is a graph showing the docking positions after each time a probe card is replaced in accordance with the present invention.

Furthermore, the docking of the test head 200 with the probe card 500 occurs with very little error because the movement of the test head 200 is carefully controlled by the manipulator 110. Accordingly, the docking operation is completed in a short amount of time. The docking heights over the course of several docking operations are illustrated in FIG. 7. As shown in FIG. 7, the docking heights of the test head in accordance with the present invention are almost invariable (0–5 mm).

Figure 6:
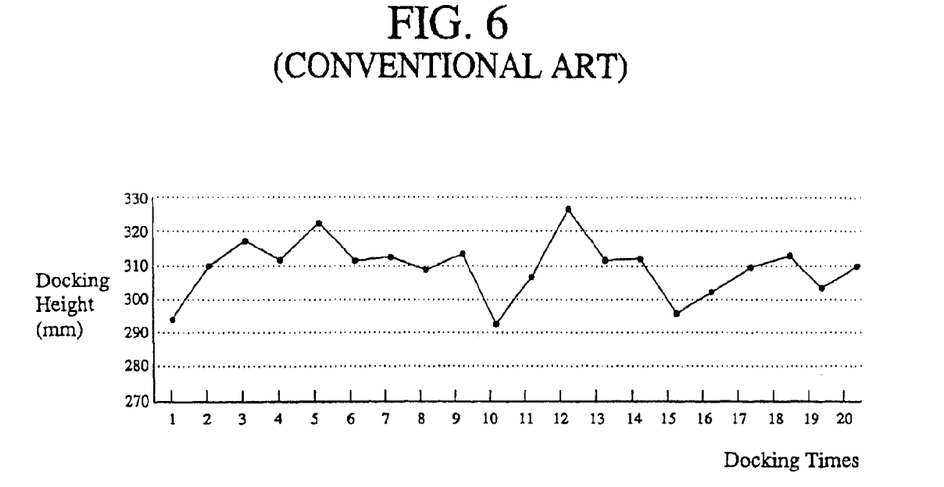
FIG. 6 is a graph showing the height of docking positions after each time a probe card is replaced in accordance with the conventional art.

On the other hand, as shown in FIG. 6, the docking heights in the conventional wafer probing machine vary significantly over the course of twenty docking operations between a minimum docking height of 290 mm and a maximum docking height of 330 mm. Therefore, after the conventional wafer probe test machine has been in use for some time, the probe card tends to be deformed or the test head fails to establish proper contact with the probe card.

Finally, although the present invention has been described with reference to the preferred embodiments thereof, various changes in form and details may be made thereto without departing from the true spirit and scope of the invention as defined by the appended claims.

What is claimed is:

1. Wafer probing test apparatus, comprising:
    a main body;
    a test head disposed over said main body, said test head having a lower surface and a plurality of pogo pins extending downwardly at said lower surface;
    a probe card to which the test head is to be docked, the probe card being supported on said main body;
    a position sensor operative to sense whether the test head is oriented properly relative to the probe card; and
    a docking height sensor operative to sense when the test head is disposed at a predetermined height relative to the probe card once the test head is properly oriented with respect to the probe card.

2. The wafer probing test apparatus according to claim 1, wherein said docking height sensor includes a down limit switch that is turned on when said pogo pins are contacted with the probe card and whether the test head is oriented properly with respect to the probe card or not.

3. The wafer probing test apparatus according to claim 2, wherein said docking height sensor operates the down limit switch and comprises at least one height sensor protrusion that is contacted with the probe card simultaneously when the pogo pins are contacted with the probe card.

4. The wafer probing test according to claim 3, wherein said probe card has a plurality of holes therein, and said position sensor comprises a plurality of position sensor protrusions exposed at the bottom of said test head and which protrusions are insertable and penetrated into the holes, respectively.

5. The wafer probing test according to claim 4, wherein said position sensor further includes at least one position limit switch judging a docking position by lifting said test head and adjusting the orientation of said test head, when said position sensor protrusions are contacted with a point except the holes and turned off.

6. The wafer probing test apparatus according to claim 5, wherein said position sensor includes at least two said position limit switches.

7. The wafer probing test apparatus according to claim 5, wherein each of said position sensor protrusions is longer than said height sensor protrusion.

8. The wafer probing test apparatus according to claim 1, wherein said probe card has a plurality of holes therein, and said position sensor comprises a plurality of position sensor protrusions exposed at the bottom of said test head and which protrusions are insertable and penetrated into the holes, respectively.

9. The wafer probing test apparatus according to claim 8, wherein said position sensor further includes at least one position limit switch judging a docking position by lifting said test head and adjusting the orientation of said test head, when said position sensor protrusions are contacted with a point except the holes and turned off.

10. The wafer probing test apparatus according to claim 9, wherein said position sensor includes at least two said position limit switches.

11. The wafer probing test apparatus according to claim 1, wherein said main body comprises an insert ring which has a plurality of guide holes in an upper surface thereof, and said probe card has a plurality of guide pins inserted in the guide holes.

12. A method of docking a test head of a wafer probing test machine with a probe card, said method comprising:
    turning on a position sensor that is operative to sense the orientation of the test head relative to the probe card;
    turning off a docking height sensor that senses when the test head is disposed at a predetermined distance relative to the probe card;
    subsequently forcing the test head down towards the probe card until the test head reaches a predetermined height;
    once said test head arrives at said predetermined height, using said position sensor to determine whether the test head is properly oriented with respect to said probe card;
    if the position sensor remains in its on-state and the docking height sensor senses that the test head is disposed at said predetermined distance relative to the probe card, turning on said docking height sensor;
    if the position sensor becomes turned-off, lifting said test head, adjusting the orientation of said test head, and then moving the test head back down to the predetermined height;
    stopping the test head once the docking height sensor has been turned on; and locking the test head in place once the test head is stopped and said docking height sensor has been turned on.

13. The method according to claim 12, wherein the turning off of the position sensor includes turning off at least one position limit switch when a sensing protrusion formed on the bottom of the test head is contacted with a point on the probe card.

14. The method according to claim 12, wherein the turning on of the docking height sensor includes turning on at least one down limit switch when a height sensing protrusion formed on the test head is contacted with the probe card.

* * * * *